(12) United States Patent
Uda et al.

(10) Patent No.: US 12,025,330 B2
(45) Date of Patent: Jul. 2, 2024

(54) VISUALIZATION SYSTEM FOR TARGET AREA OF AIR CONDITIONER

(71) Applicant: DAIKIN INDUSTRIES, LTD., Osaka (JP)

(72) Inventors: Masafumi Uda, Osaka (JP); Tomoyuki Haikawa, Osaka (JP); Yone Yun, Osaka (JP); Yoshiaki Nakazawa, Osaka (JP); Yuki Yamoto, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/374,130

(22) Filed: Sep. 28, 2023

(65) Prior Publication Data

US 2024/0019152 A1 Jan. 18, 2024

Related U.S. Application Data

(63) Continuation of application No. PCT/JP2022/014936, filed on Mar. 28, 2022.

(30) Foreign Application Priority Data

Mar. 31, 2021 (JP) ................. 2021-060830

(51) Int. Cl.
*F24F 11/52* (2018.01)
*F24F 11/49* (2018.01)
(Continued)

(52) U.S. Cl.
CPC .............. *F24F 11/52* (2018.01); *F24F 11/49* (2018.01); *F24F 11/64* (2018.01); *G06V 10/70* (2022.01); *G06V 20/50* (2022.01)

(58) Field of Classification Search
CPC .. F24F 11/52; F24F 11/49; F24F 11/64; F24F 11/30; F24F 11/46; F24F 11/74; G06V 10/70; G06V 20/50; Y02B 30/70
See application file for complete search history.

(56) References Cited

U.S. PATENT DOCUMENTS

2002/0029129 A1   3/2002  Satoh et al.
2014/0345309 A1*  11/2014  Ishikawa ................. F25B 13/00
                                             62/277
(Continued)

FOREIGN PATENT DOCUMENTS

CN   103032935 A     4/2013
CN   110736244 A  *  1/2020  .............. F24F 11/64
(Continued)

OTHER PUBLICATIONS

International Search Report (PCT/ISA/210), issued in PCT/JP2022/014936, dated Jun. 14, 2022.
(Continued)

*Primary Examiner* — Alicia M. Choi
(74) *Attorney, Agent, or Firm* — Birch, Stewart, Kolasch & Birch, LLP

(57) ABSTRACT

A visualization system includes: a receiver configured to receive an input of arrangement information indicating a location of an object image on a target area image showing a target area; a storage storing correspondence information; a controller configured to output information indicating an air condition of the target area based on the arrangement information on the object image and the correspondence information; and a display configured to display at least one of information indicating the target area image or the information indicating the air condition of the target area. The object includes an air conditioner and a fixture.

17 Claims, 9 Drawing Sheets

(51) Int. Cl.
*F24F 11/64* (2018.01)
*G06V 10/70* (2022.01)
*G06V 20/50* (2022.01)

(56) References Cited

U.S. PATENT DOCUMENTS

| | | | | |
|---|---|---|---|---|
| 2016/0109148 | A1* | 4/2016 | Honda | G01J 5/025 |
| | | | | 702/135 |
| 2016/0231039 | A1* | 8/2016 | Song | F24F 11/49 |
| 2019/0285300 | A1* | 9/2019 | Kwong | F24F 11/56 |
| 2020/0033016 | A1* | 1/2020 | Ogura | F24F 11/79 |
| 2021/0164677 | A1* | 6/2021 | Lee | G05B 19/042 |
| 2021/0356161 | A1* | 11/2021 | Chen | G05B 19/042 |
| 2021/0366078 | A1* | 11/2021 | Tezuka | G06T 7/20 |
| 2022/0018567 | A1* | 1/2022 | Ock | F24F 11/64 |
| 2022/0252458 | A1* | 8/2022 | Sudo | F24F 11/46 |
| 2022/0307715 | A1* | 9/2022 | Linden | B01D 46/0028 |
| 2023/0134914 | A1* | 5/2023 | Suzuka | A61B 5/0507 |
| | | | | 600/301 |

FOREIGN PATENT DOCUMENTS

| | | | | |
|---|---|---|---|---|
| CN | 110986287 A | * | 4/2020 | ............. F24F 11/46 |
| CN | 111649433 A | | 9/2020 | |
| CN | 112149364 A | | 12/2020 | |
| JP | 2001-344294 A | | 12/2001 | |
| JP | 2002-32701 A | | 1/2002 | |
| JP | 2004-101058 A | | 4/2004 | |
| JP | 2007-310528 A | | 11/2007 | |
| JP | 2021-33684 A | | 3/2021 | |
| KR | 10-1941921 B1 | | 1/2019 | |
| WO | WO-2005114058 A1 | * | 12/2005 | .......... F24F 11/0086 |
| WO | WO 2020/121492 A1 | | 6/2020 | |

OTHER PUBLICATIONS

International Preliminary Report on Patentability and English translation of the Written Opinion of the International Searching Authority for International Application No. PCT/JP2022/014936, dated Oct. 12, 2023.

* cited by examiner

VISUALIZATION SYSTEM FOR TARGET AREA OF AIR CONDITIONER

CROSS REFERENCE TO RELATED APPLICATIONS

This application is a Continuation of PCT International Application No. PCT/JP2022/014936, filed on Mar. 28, 2022, which claims priority under 35 U.S.C. 119(a) to Patent Application No. 2021-060830, filed in Japan on Mar. 31, 2021, all of which are hereby expressly incorporated by reference into the present application.

TECHNICAL FIELD

The present disclosure relates to a visualization system and a program.

BACKGROUND ART

The technique of fluid analysis simulation in a predetermined target area, such as a building, is known (e.g., Patent Document 1). In recent years, there has been an increasing interest in ventilation and airflow in view of improving spatial environment. There are also providers of the services of analyzing the air conditions, such as the airflow, in a building.

CITATION LIST

Patent Document

Patent Document 1: Japanese Unexamined Patent Publication No. 2001-344294

SUMMARY

A first aspect of the present disclosure is directed to a visualization system. The visualization system includes: a receiver (120) configured to receive an input of arrangement information indicating a location of an object image on a target area image (e) showing a target area (E); a storage (220) configured to store correspondence information (221, 222, 223) indicating the object image and information on an effect of an object shown by the object image on an air condition in association with each other; a controller (230) configured to output the information indicating an air condition of the target area (E) based on the arrangement information on the object image and the correspondence information (221, 222, 223); and a display (110) configured to display at least one of information indicating the target area image (e) or the information indicating the air condition of the target area (E). The object includes an air conditioner (Y) and a fixture (X).

DESCRIPTION OF EMBODIMENT

Figure 1:
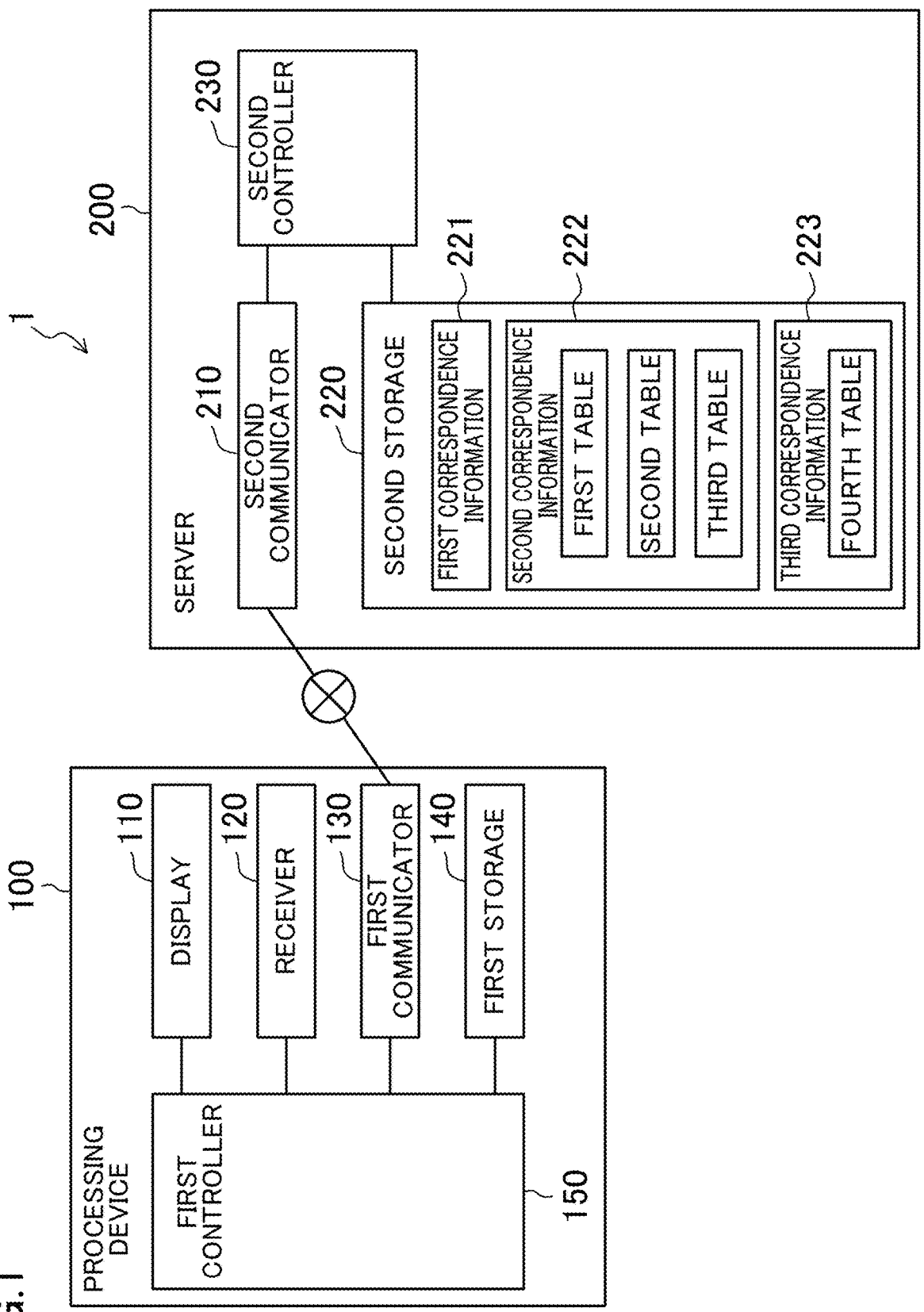
FIG. 1 is a block diagram showing a configuration of a visualization system according to an embodiment of the present disclosure.

An embodiment of the present disclosure will be described with reference to the drawings. Note that like reference characters denote the same or equivalent components in the drawings, and the detailed description thereof, the description of advantages associated therewith, and other descriptions will not be repeated.

With reference to FIG. 1, a visualization system (1) of an embodiment of the present disclosure will be described. FIG. 1 is a block diagram showing a configuration of the visualization system (1) according to the embodiment of the present disclosure.

Figure 3:
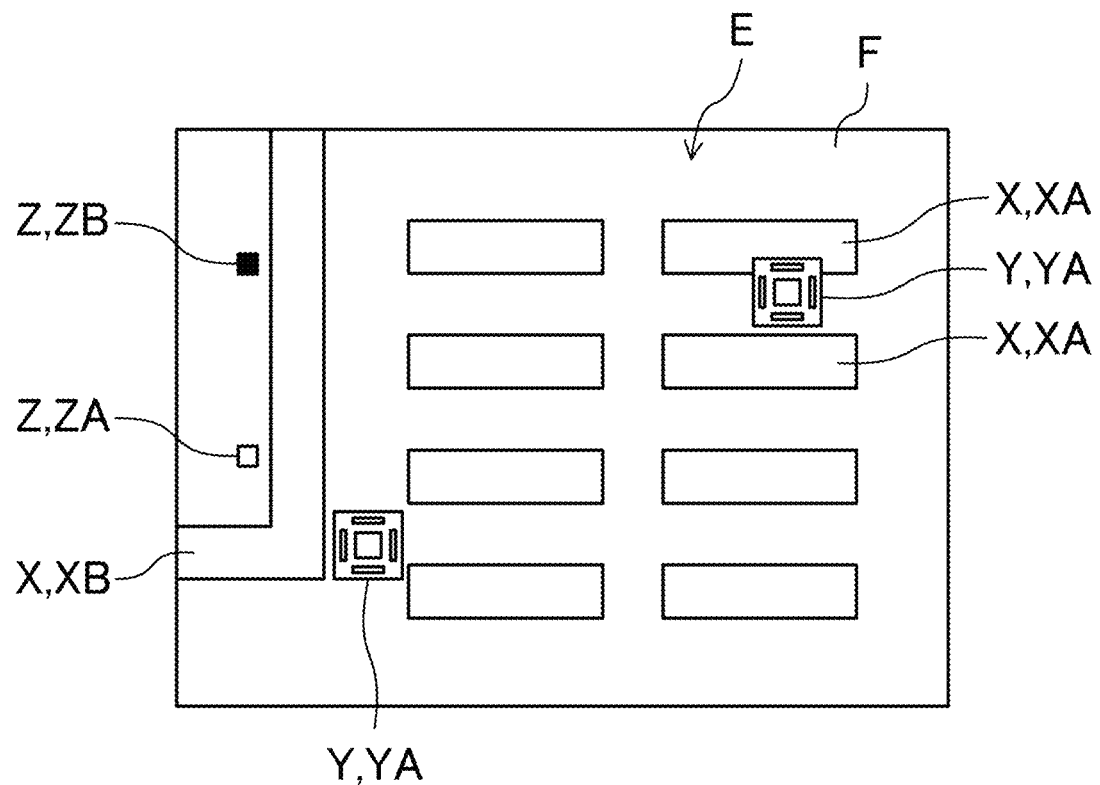
FIG. 3 is a plan view of a target area.

The visualization system (1) is for visualizing the air conditions in a target area (E) (see FIG. 3). The visualization system (1) is used to determine whether ventilation and air purification are appropriately performed in the target area (E), for example, by making the air conditions in the target area (E) visible and checkable.

General Configuration

As illustrated in FIG. 1, the visualization system (1) includes a processing device (100) and a server (200).

The processing device (100) is a terminal, such as a smartphone or a personal computer (PC). In this embodiment, the processing device (100) is a mobile terminal, such as a smartphone or a tablet PC. In this embodiment, an operator shows up to the target area (E) while carrying the processing device (100) and uses the processing device (100) for an operation of checking the air conditions in the target area (E). The processing device (100) may be a stationary terminal, such as a desktop PC.

The processing device (100) includes a display (110), a receiver (120), a first communicator (130), a first storage (140), and a first controller (150).

The display (110) includes a liquid crystal panel, for example, and displays images. In this embodiment, the display (110) functions as a touch panel.

The receiver (120) receives instructions from the outside. In this embodiment, the receiver (120) is a touch panel forming the display (110). The receiver (120) may be an input device, such as a keyboard or a mouse.

The first communicator (130) establishes wired or wireless communications with the server (200). In this embodiment, the first communicator (130) includes a communication module (communications equipment), such as a LAN board, and establishes wireless communications with the server (200) via a network, such as the Internet.

The first communicator (130) is an example of the "transmitting section" and the "receiving section" of the present disclosure.

The first storage (140) includes a main storage device (e.g., a semiconductor memory), such as a read only memory (ROM) or a random access memory (RAM), and may further include an auxiliary storage device (e.g., a hard disk drive). The first storage (140) stores various computer programs to be executed by the first controller (150).

The first controller (150) includes a processor, such as a central processing unit (CPU) or a micro processing unit (MPU). The first controller (150) controls the components of the processing device (100) by executing the computer programs stored in the first storage (140).

The server (200) includes a second communicator (210), a second storage (220), and a second controller (230).

The second communicator (210) establishes wired or wireless communications with the processing device (100). In this embodiment, the second communicator (210) includes a communication module (communications equipment), such as a LAN board, and establishes wireless communications with the processing device (100) via a network, such as the Internet.

The second storage (220) includes a main storage device, such as a ROM or a RAM, and may further include an auxiliary storage device. The second storage (220) stores various computer programs to be executed by the second controller (230).

The second storage (220) stores first correspondence information (221), second correspondence information (222), and third correspondence information (223). The first correspondence information (221) to the third correspondence information (223) will be described later.

The second controller (230) includes a processor, such as a CPU or an MPU. The first controller (150) controls the components of the server (200) by executing the computer programs stored in the second controller (230).

Target Area

The target area (E) according to this embodiment will be described with reference to FIG. 3. FIG. 3 is a plan view showing the target area (E) of this embodiment.

As illustrated in FIG. 3, the target area (E) has a rectangular floor surface (F). Placed in the target area (E) are objects. In this embodiment, the object includes fixtures (X), air conditioners (Y), and ventilators (Z). In this embodiment, the fixtures (X) in the target area (E) include a product shelf (XA) and a checkout counter (XB). The air conditioners (Y) in the target area (E) are ceiling cassette air conditioners (YA). The ventilators (Z) in the target area (E) include an air inlet (ZA) and an air outlet (ZB).

Operation of Visualization System

Figure 2:
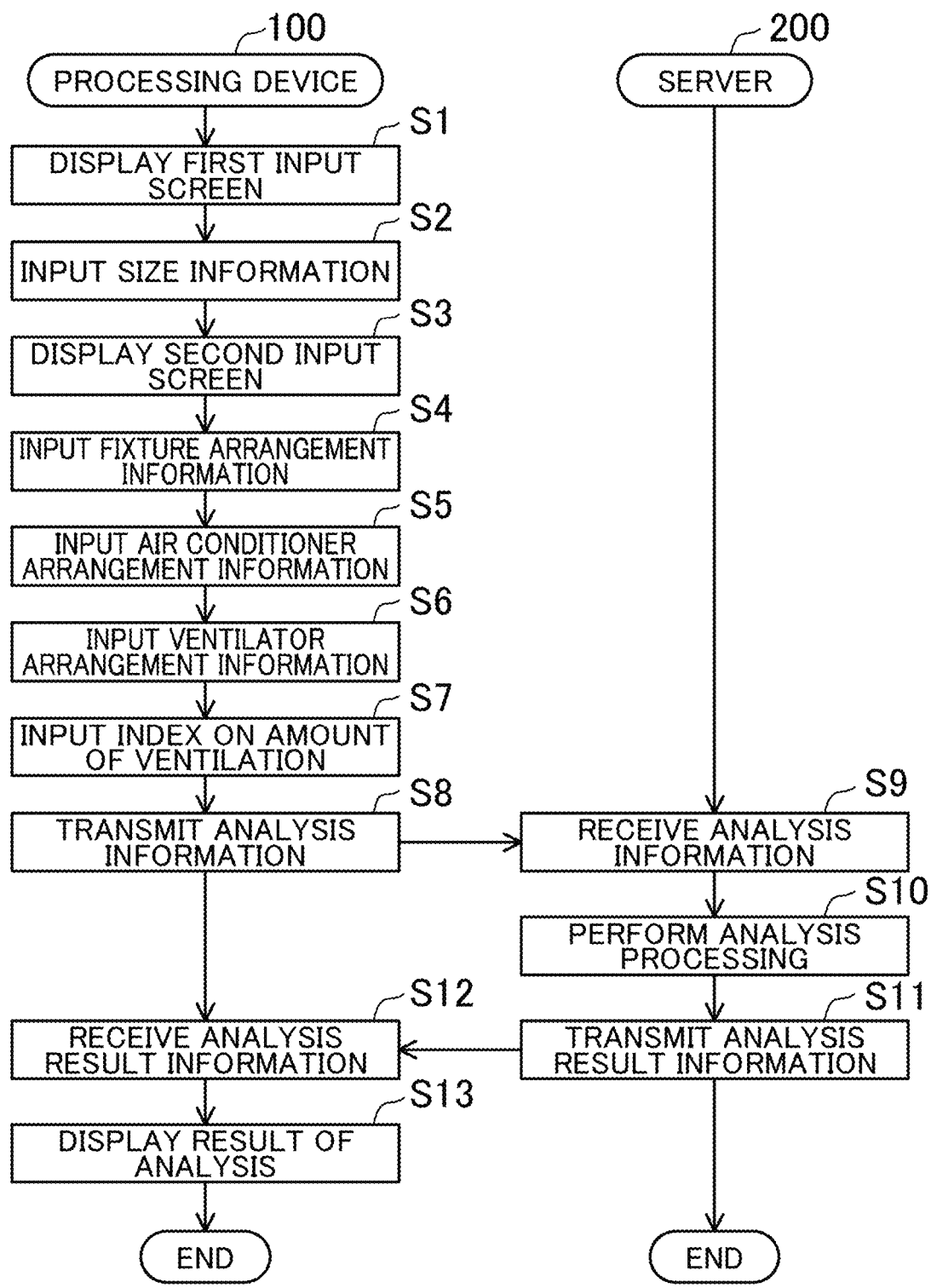
FIG. 2 is a flowchart showing an operation of the visualization system.

An operation of the visualization system (1) will be described with reference to FIGS. 1 to 9. FIG. 2 is a flowchart showing the operation of the visualization system (1). FIG. 3 is a plan view of the target area (E).

As illustrated in FIGS. 1 to 3, the operator shows up to the target area (E) to check the air conditions in the target area (E). After arriving at the target area (E), the operator operates the processing device (100) to start an operation for visualizing the air conditions in the target area (E).

Figure 4:
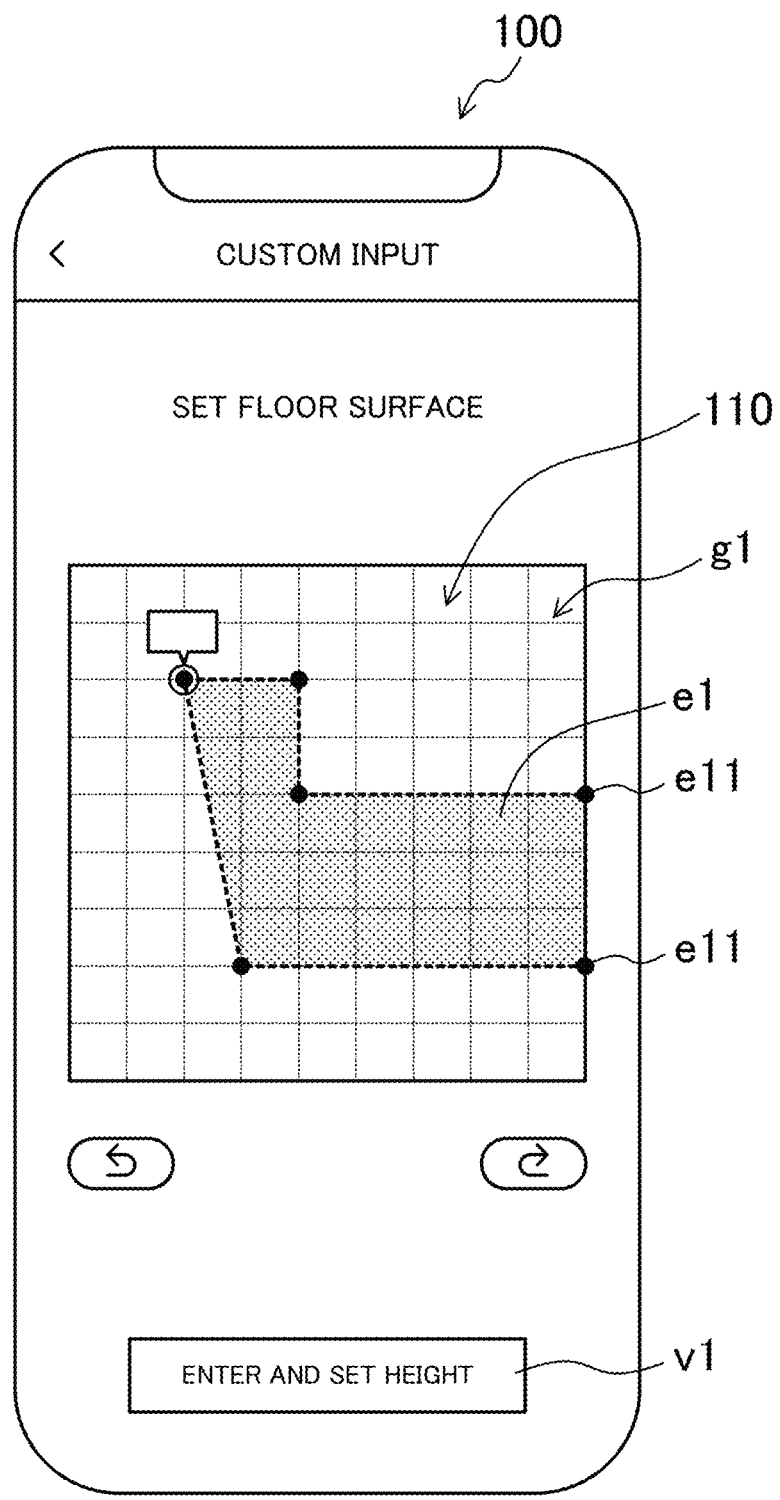
FIG. 4 shows a first input screen.

In a step S1, after the start of the operation, the display (110) of the processing device (100) displays a first input screen (g1). The first input screen (g1) is for inputting floor surface information on the target area (E). FIG. 4 shows the first input screen (g1).

In a step S2, the receiver (120) of the processing device (100) receives an input of the size information on the size of the target area (E). The size information includes floor surface information indicating the size of the floor surface of the target area (E) and height information indicating the height from the floor surface to the ceiling of the target area (E).

As illustrated in FIG. 4, the operator inputs the floor surface information from the first input screen (g1). The first input screen (g1) displays a floor surface setting image (e1) for setting the size of the floor surface. The operator performs a drag-and-drop operation at a corner (e11) of the floor surface setting image (e1) and a shape change of the floor surface setting image (e1) on the input screen (g1) to approximate to a scale drawing of the floor surface (F) of the actual target area (E). Hereinafter, the image obtained by the shape change of the floor surface setting image (e1) may be referred to as a "target area image" (e) (see FIG. 5). The target area image (e) is in a shape approximate to the scale drawing of the floor surface (F) of the actual target area (E). With the target area image (e) formed through the shape change of the floor surface setting image (e1), the input operation of the floor surface information on the target area (E) is completed.

After the formation of the target area image (e), the operator performs the touch operation on the icon (v1) on the input screen (g1). The touch operation on the icon (v1) causes the display of an input screen (not shown) for inputting the height information on the target area (E). For example, the operator inputs a numerical value indicating the height of the target area (E) through the touch operation on a number icon displayed on the input screen for inputting the height information. The numerical value indicating the height of the target area (E) may be input using a range slider for inputting a numerical value. As a result, the input operation of the height information on the target area (E) is completed.

After the completion of the input operation of the floor surface information on the target area (E) and the height information, the process proceeds to a step S3.

In the step S3, the display (110) displays a second input screen (g2). The second input screen (g2) is for inputting arrangement information indicating the locations of object images on the target area image (e). The object images include fixture images (x) showing fixtures (X) (see FIG. 6A), air conditioner images (y) showing air conditioners (Y) (see FIG. 6B), and ventilator images (z) showing ventilators (Z) (see FIG. 6C).

The top (g21) of the second input screen (g2) displays a plurality of types of icons (v) for selecting the type of an object. In this embodiment, the plurality of types of icons (v) include an icon (v2) "FIXTURE", an icon (v3) "AIR CONDITIONER", and an icon (v4) "VENTILATOR". The vertical center (g22) of the second input screen (g2) displays the target area image (e) formed in the step S2. The bottom (g23) of the second input screen (g2) displays images of the objects corresponding to the icon selected from the plurality of types of icons (v2, v3, and v4) displayed at the top (g21).

In a step S4, the receiver (120) of the processing device (100) receives an input of fixture arrangement information. The fixture arrangement information indicates the locations of the fixture images (x) on the target area image (e). The fixture arrangement information is a first example of the "arrangement information" according to the present disclosure.

An example procedure of inputting the fixture arrangement information will be described.

Figure 5:
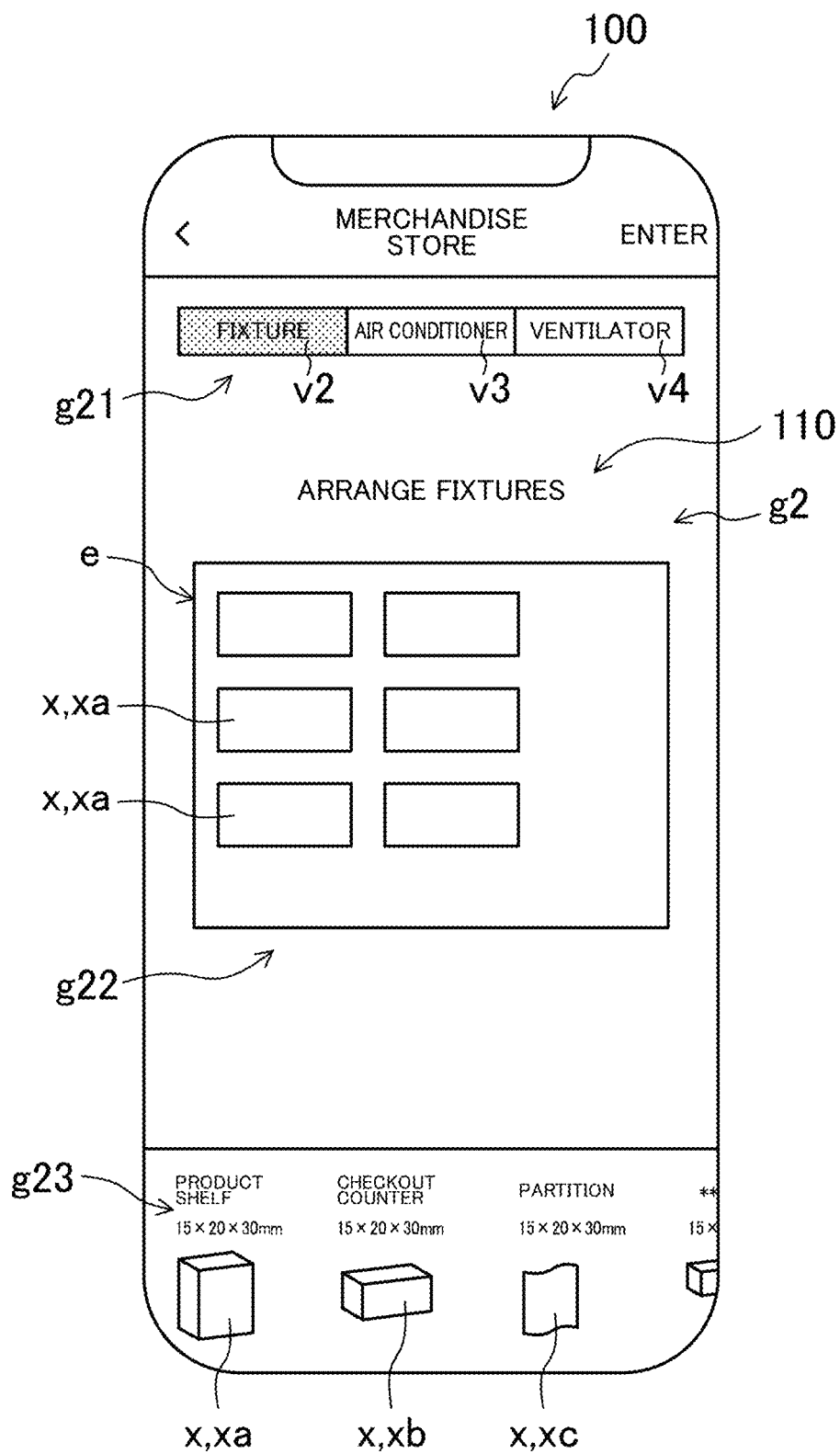
FIG. 5 shows a second input screen.
Figure 6A:
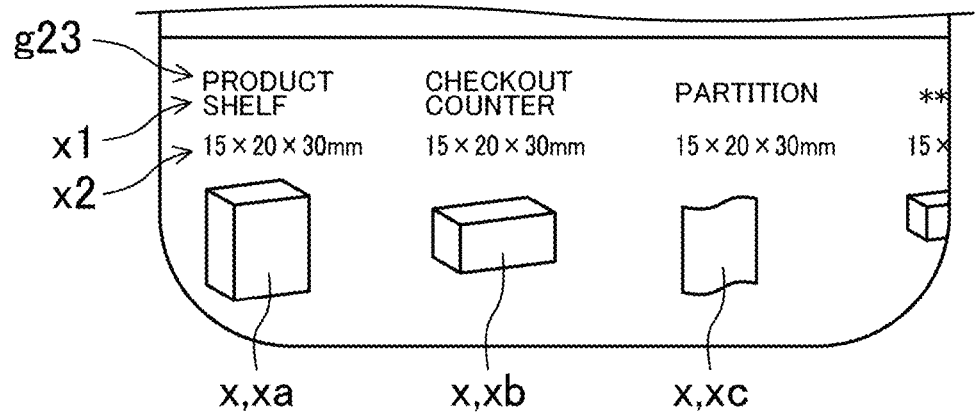
FIG. 6A shows a fixture image (x).

As illustrated in FIG. 5 and FIG. 6A, the operator performs the touch operation on the icon (v2) indicating the fixtures (X) among the icons (v2) to (v4) at the top (g21) of the second input screen (g2). Accordingly, the bottom (g23) of the second input screen (g2) displays a plurality of types of fixture images (x).

A horizontal flick operation of the bottom (g23) of the second input screen (g2) allows the slide of a fixture image (x) currently displayed at the bottom (g23) and the appearance of different types of fixture images (x) at the bottom (g23).

The bottom (g23) of the second input screen (g2) displays the plurality of types of fixture images (x), a plurality of types of fixture names (x1), and a plurality of types of fixture dimensions (x2) in association with each other. The fixture names (x1) are the names of the fixtures (X) shown by the associated fixture images (x). Through visual check of the fixture names (x1), the operator can easily specify the types of the fixtures (X) shown by the associated fixture images (x). The fixture dimensions (x2) are the dimensions of the fixtures (X) shown by the associated fixture images (x). The fixture dimensions (x2) are set to default values. Note that the fixture dimensions (x2) may be changeable from the default values by the receiver (120).

The operator inputs the fixture arrangement information as follows. The operator performs a drag-and-drop operation on a fixture image (x) showing a fixture (X) to be placed on the target area (E) among the plurality of types of fixture images (x) displayed at the bottom (g23) of the second input screen (g2) and moving and placing the fixture image (x) on the target area image (e). At this time, the operator places the fixture image (x) on the target area image (e) to match the location of the fixture (X) in the actual target area (E). The fixture arrangement information on all the fixtures (X) is input on the target area image (e) on the target area (E). As a result, the process proceeds to a step S5.

As illustrated in FIGS. 1 and 2, in the step S5, the receiver (120) of the processing device (100) receives an input of air conditioner arrangement information. The air conditioner arrangement information indicates the locations of the air conditioner images (y) on the target area image (e). The air conditioner arrangement information is a second example of the "arrangement information" according to the present disclosure.

An example procedure of inputting the air conditioner arrangement information will be described.

Figure 6B:
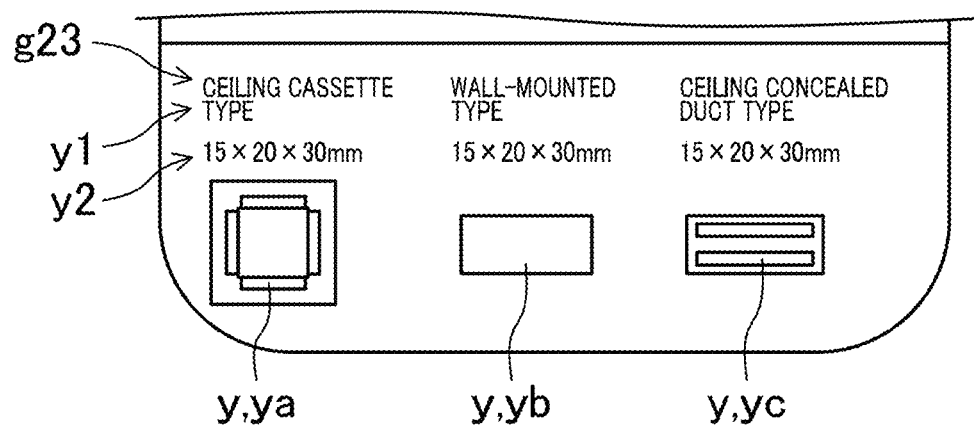
FIG. 6B shows an air conditioner image (y).

As illustrated in FIG. 5 and FIG. 6B, the operator performs the touch operation on the icon (v3) indicating air conditioners (Y) among the icons (v2) to (v4) at the top (g21) of the second input screen (g2). Accordingly, the bottom (g23) of the second input screen (g2) displays a plurality of types of air conditioner images (y).

The bottom (g23) of the second input screen (g2) displays the plurality of types of air conditioner images (y), a plurality of types of air conditioner names (y1), and a plurality of types of air conditioner dimensions (y2) in association with each other. The air conditioner names (y1) are the names of the air conditioners (Y) shown by the associated air conditioner images (y). Through visual check of the air conditioner names (y1), the operator can easily specify the types of the air conditioners (Y) shown by the associated air conditioner images (y). The air conditioner dimensions (y2) are the dimensions of the air conditioners (Y) shown by the associated air conditioner images (y). The air conditioner dimensions (y2) are set to default values. Note that the air conditioner dimensions (y2) may be changeable from the default values by the receiver (120).

The operator inputs the air conditioner arrangement information as follows. The operator performs a drag-and-drop operation on an air conditioner image (y) showing an air conditioner (Y) to be placed on the target area (E) among the plurality of types of air conditioner images (y) displayed at the bottom (g23) of the second input screen (g2) and moving and placing the air conditioner image (y) on the target area image (e). At this time, the operator places the air conditioner image (y) on the target area image (e) to match the location of the air conditioner (Y) in the actual target area (E). The air conditioner arrangement information is input on the target area image (e) for all the air conditioners (Y) on the target area (E). As a result, the process proceeds to a step S6.

As illustrated in FIGS. 1 and 2, in the step S6, the receiver (120) of the processing device (100) receives an input of third arrangement information. The third arrangement information indicates the locations of the ventilator images (z) on the target area image (e). The ventilator arrangement information is a third example of the "arrangement information" according to the present disclosure.

An example procedure of inputting the ventilator arrangement information will be described.

Figure 6C:
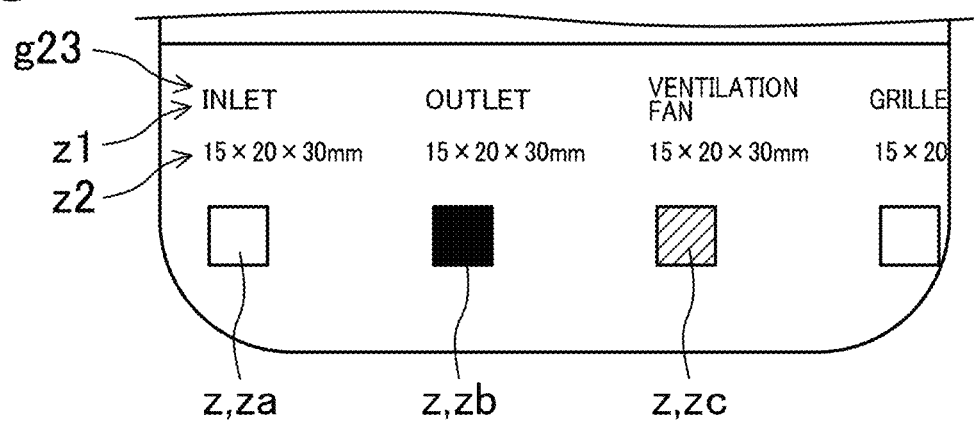
FIG. 6C shows a ventilator image (z).

As illustrated in FIG. 5 and FIG. 6C, the operator performs the touch operation on the icon (v4) indicating ventilators (Z) among the icons (v2) to (v4) at the top (g21) of the second input screen (g2). Accordingly, the bottom (g23) of the second input screen (g2) displays a plurality of types of ventilator images (z).

The bottom (g23) of the second input screen (g2) displays the plurality of types of ventilator images (z), a plurality of types of ventilator names (z1), and a plurality of types of ventilator dimensions (z2) in association with each other. The ventilator names (z1) are the names of the ventilators (Z) shown by the associated ventilator images (z). Through visual check of the ventilator names (z1), the operator can easily specify the types of the ventilators (Z) shown by the associated ventilator images (z). The ventilator dimensions (z2) are the dimensions of the ventilators (Z) shown by the associated ventilator images (z). The ventilator dimensions (z2) are set to default values. Note that the ventilator dimensions (z2) may be changeable from the default values by the receiver (120).

The operator inputs the ventilator arrangement information as follows. The operator performs a drag-and-drop operation on a ventilator image (z) showing a ventilator (Z) to be placed on the target area (E) among the plurality of types of ventilator images (z) displayed at the bottom (g23) of the second input screen (g2) and moving and placing the ventilator image (z) on the target area image (e). At this time, the operator places the ventilator image (z) on the target area image (e) to match the location of the ventilator (Z) in the actual target area (E). The ventilator arrangement information is input on the target area image (e) for all the ventilators (Z) in the target area (E).

Figure 7:
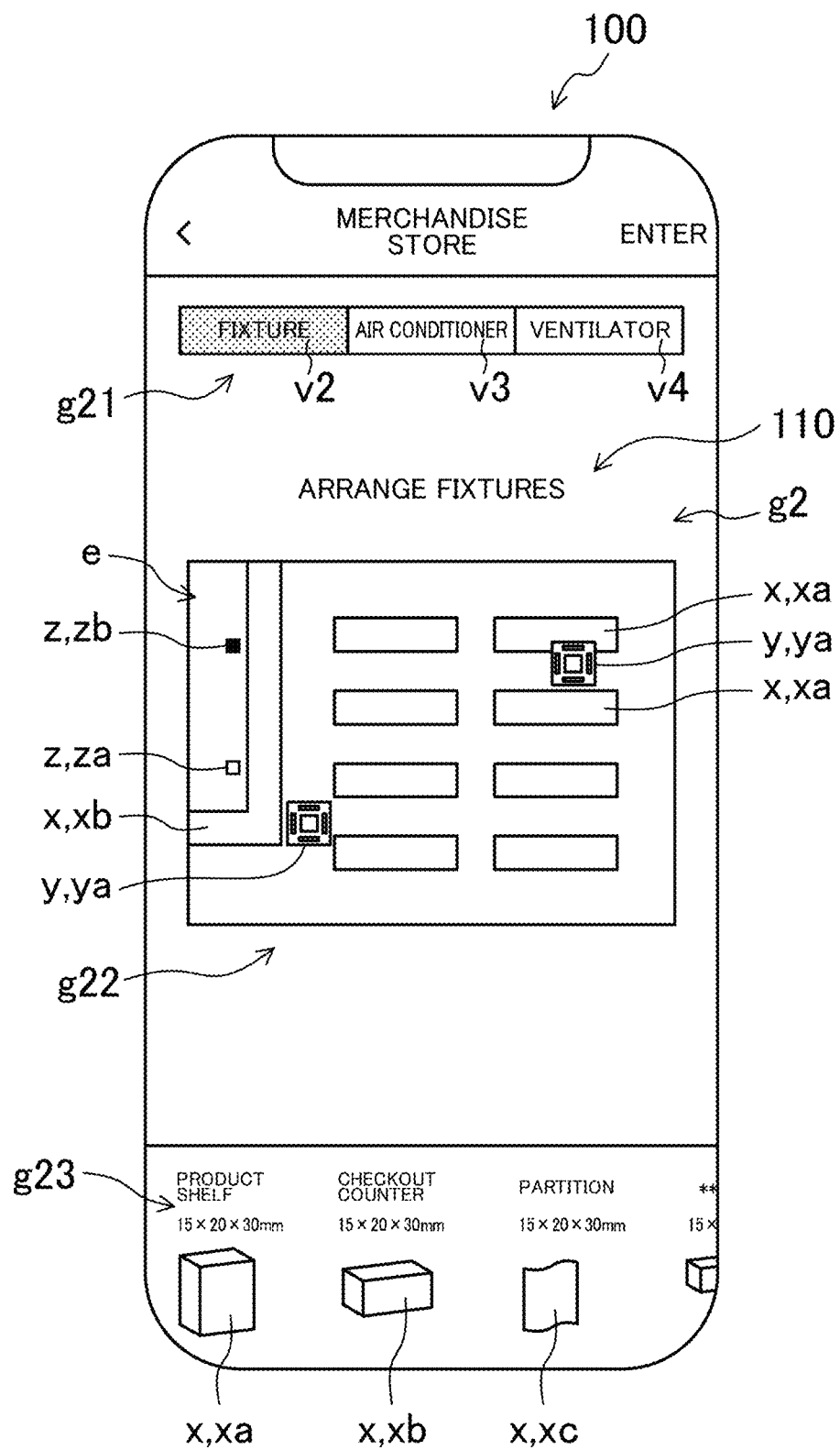
FIG. 7 shows a second input screen.

FIG. 7 shows the second input screen (g2) under the following conditions after the end of the processing in the steps S4 to S6. The object images (i.e., the fixture images (x), the air conditioner images (y), and the ventilator images (z)) are arranged on the target area image (e) to match the locations of the objects (i.e., the fixtures (X), the air conditioners (Y), and the ventilators (Z)) in the actual target area (E) (see FIG. 3).

After the end of the processing shown in the step S6, the process proceeds to a step S7.

As illustrated in FIGS. 1 and 2, in the step S7, the receiver (120) of the processing device (100) receives an input of an index on the amount of ventilation by ventilators (Z). Specifically, the index on the amount of ventilation by the ventilators (Z) is related to the amount of ventilation by the ventilators (Z) shown by the ventilator images (z) for which the ventilator arrangement information is set in the step S6. The index on the amount of ventilation by each ventilator (Z) includes information indicating the air volume of the ventilator (Z), information indicating the number of times of ventilation by the ventilator (Z) (e.g., the number of times of ventilation per unit time), or information indicating the expected number of people present in the target area (E). The amount of ventilation indicates the volume of air in the target area (E) to be replaced per unit time.

As illustrated in FIG. 2, after the end of the processing shown in the steps S4 to S7, the processing proceeds to a step S8. The process does not necessarily proceed in the order of the steps S4, S5, S6, and S7 as in this embodiment and the order is not limited.

As illustrated in FIGS. 1 and 2, in the step S8, the first communicator (130) of the processing device (100) transmits analysis information to the server (200).

The analysis information includes the size information on the target area (E) received by the receiver (120) in the step S2, the fixture arrangement information, the air conditioner arrangement information, and the ventilator arrangement information received by the receiver (120) in the steps S4 to S6, and the index on the amount of ventilation by a ventilator (Z) received by the receiver (120) in the step S7.

As illustrated in FIGS. 1 and 2, in a step S9, the second communicator (210) of the server (200) receives the analysis information from the processing device (100).

In a step S10, the second controller (230) of the server (200) performs analysis processing based on the analysis information. The analysis processing is analyzing the air conditions in the target area (E).

Device Configuration of Server (200) for Analysis Processing

The second storage (220) of the server (200) stores various information for the analysis processing. The various information stored in the second storage (220) include first correspondence information (221), second correspondence information (222), and third correspondence information (223).

Fixture Effect Information

The first correspondence information (221) indicates each fixture image (x) and effect information in association with each other. The effect information is the information on the effects of the fixture (X) shown by the fixture image (x) on the air conditions. Hereinafter, the "information on the effects of the fixture (X) shown by the fixture image (x) on the air conditions" may be referred to as "fixture effect information". The fixture effect information includes, for example, information indicating the influence of the fixture (X) on the airflow generated by the air conditioner (Y) or any other equipment (e.g., information on how the fixture (X) changes the airflow).

The first correspondence information (221) is set for each of the plurality of types of fixture images (x) (e.g., a first fixture image (xa) showing the product shelf (XA), a second fixture image (xb) showing the checkout counter (XB), a third fixture image (xc) showing a partition) (see (a) of FIG. 6).

The second controller (230) of the server (200) outputs the fixture effect information for all the fixture images (x) arranged on the target area image (e) in the step S4.

Air Conditioner Effect Information

The second correspondence information (222) indicates each air conditioner image (y) and effect information in association with each other. The effect information is the information on the effects of the air conditioner (Y) shown by the air conditioner image (y) on the air conditions. Hereinafter, the "information on the effects of the air conditioner (Y) shown by the air conditioner image (y) on the air conditions" may be referred to as "air conditioner effect information". The air conditioner effect information includes, for example, information indicating the air-blowing direction of the air conditioner (Y).

The second controller (230) of the server (200) outputs the air conditioner effect information for all the air conditioner images (y) arranged on the target area image (e) in the step S5.

Air Conditioner Air Volume Information

The air conditioner effect information according to the second correspondence information (222) includes a first table, a second table, and a third table. The first table shows size information indicating the size (cm3) of the target area (E) and an air conditioning load (a cooling and heating load) (kW/cm3) in association with each other. The second table shows an air conditioning load and the required air conditioning capacity (kW) in association with each other. The third table shows the air conditioning capacity and the air volume of the air conditioner (Y) in association with each other. Using the first to third tables, the second controller (230) of the server (200) outputs the air volume of the air conditioner (Y) based on the information on the size of the target area (E) received by the receiver (120) in the step S2. Specifically, the second controller (230) of the server (200) first outputs the air conditioning load corresponding to the size of the target area (E) using the size information on the target area (E) and the first table, outputs the air conditioning capacity using the output air conditioning load and the second table, and then outputs the air volume of the air conditioner (Y) using the output air conditioning capacity and the third table. Assume that there are a plurality of air conditioners (Y) in the target area (E) as in this embodiment (see FIG. 3). In this case, the air volume of each air conditioner (Y) is set to, for example, the value obtained by equally dividing the air volume output based on the size information on the target area (E) as described above. Hereinafter, the air volume set for each air conditioner (Y) may be collectively referred to as "air conditioner air volume information".

The second correspondence information (222) is set for each of the plurality of types of air conditioner images (y) (e.g., a first air conditioner image (ya) showing a ceiling cassette air conditioner (YA), a second air conditioner image (yb) showing a wall-mounted air conditioner, and a third air conditioner image (yc) showing a ceiling concealed duct air conditioner) (see FIG. 6B).

Ventilator Effect Information

The third correspondence information (223) indicates each ventilator image (z) and effect information in association with each other. The effect information is the information on the effects of the ventilator (Z) shown by the ventilator image (z) on the air conditions. Hereinafter, the "information on the effects of the ventilator (Z) shown by the ventilator image (z) on the air conditions" may be referred to as "ventilator effect information". The ventilator effect information includes, for example, information indicating the air blowing direction of the ventilator (Z) (e.g., the outlet (ZB) or a ventilation fan), information indicating the air intake direction of the ventilator (Z) (e.g., the air inlet (ZA)).

The second controller (230) of the server (200) outputs the ventilator effect information for all the ventilator images (z) arranged on the target area image (e) in the step S6.

Ventilation Amount Information

The ventilator effect information according to the third correspondence information (223) includes a fourth table. The fourth table indicates the amount of ventilation and an index in association with each other. Using the fourth table, the second controller (230) of the server (200) outputs the amount of ventilation associated with the index (see the step S7) received by the receiver (120) and outputs the amount of ventilation as the amount of ventilation by the ventilator (Z) in the target area (E). In this manner, the amount of ventilation output using the fourth table and the index (see the step S7) of the amount of ventilation received by the receiver (120) may be referred to as "ventilation amount information".

The third correspondence information (223) is set for each of the plurality of types of ventilator images (z) (e.g., a first ventilator image (za) showing the air inlet (ZA), a second ventilator image (zb) showing the air outlet (ZB), a third ventilator image (zc) showing the ventilation fan) (see FIG. 6C).

Procedure of Analysis Processing

The second controller (230) of the server (200) inputs the following information as parameters to a predetermined program (e.g., dedicated or general-purpose fluid analysis software) for fluid analysis simulation to output the result of analysis of the air conditions in the target area (E). The information includes the fixture arrangement information (see the step S4), the fixture effect information, the air conditioner arrangement information (see the step S5), the air conditioner effect information, the air conditioner air volume information, the ventilator arrangement information (see the step S6), the ventilator effect information, and the ventilation amount information. The predetermined program is stored in the second storage (220) of the server (200). In this embodiment, output as a result of analysis is information indicating the age of the air in the target area (E). The age of the air indicates the time required for the air entering the target area (E) to reach a predetermined point in the target area (E). Younger air represents fresher air.

As illustrated in FIGS. 1 and 2, in a step S11, the second communicator (210) of the server (200) transmits information indicating a result of analysis to the processing device (100).

In a step S12, the first communicator (130) of the processing device (100) receives the information indicating the result of analysis from the server (200).

Figure 8:
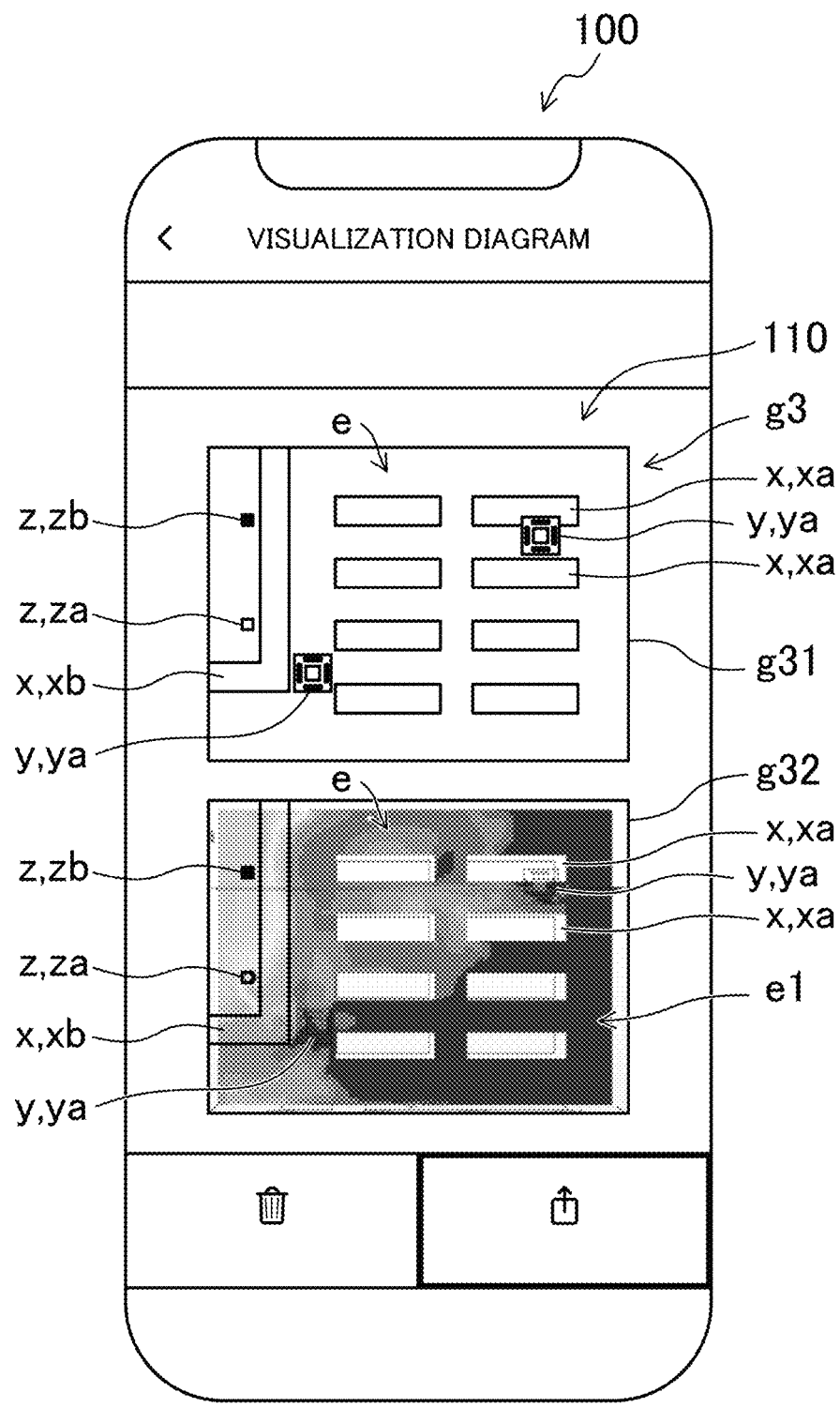
FIG. 8 shows a screen for displaying a result of analysis.

As illustrated in FIGS. 1, 2, and 8, in a step S13, the display (110) of the processing device (100) displays an analysis result display screen (g3).

The analysis result display screen (g3) includes a first screen (g31) and a second screen (g32). The first screen (g31) displays the target area image (e) shown in FIG. 7, that is, an image with the same content as the image used by the server (200) for the analysis processing. The second screen (g32) displays information indicating the result of analysis of the air conditions in the target area (E) by the server (200). In this embodiment, the second screen (g32) displays information on the age of the air in the target area (E). In this embodiment, the second screen (g32) is displayed below the first screen (g31).

The second screen (g32) displays the information indicating the result of analysis to overlap each other. In this embodiment, the second screen (g32) displays the information indicating the result of analysis in the form of a contour diagram representing older and more stagnant air in a darker color. In this embodiment, the bottom right area (e1) of the target area image (e) is darker in color and thus contains older and more stagnant air. By visually checking the second screen (g32), the operator can easily know that the air in the bottom right of the target area (E) is older and more stagnant as in the target area image (e).

Advantages of Embodiment

As described above, the second storage (220) stores the correspondence information (the first to third correspondence information (221) to (223)) indicating the object images (the fixture images (x), the air conditioner images (y), and the ventilator images (z)) and the information on the effects of the objects (the fixtures (X), the air conditioners (Y), and the ventilators (Z)) shown by the object images on the air conditions in association with each other. The second controller (230) outputs information indicating the air conditions in the target area (E) based on the arrangement information on the object images (e.g., the fixture arrangement information, the air conditioner arrangement information, and the ventilator arrangement information) and the correspondence information. In this configuration, the correspondence information stored in the second storage (220) indicates the object images and the information on the effects of the objects shown by the object images on the air conditions in association with each other. There is thus no need for an operator to check and input the information on the effects of the objects on the air conditions in the target area (E) into the processing device (100) to output the air conditions in the target area (E). This reduces the burden on the operator and allows the operator to easily check the air conditions in the target area (E). The information on the effects of the air conditioner (Y) on the air conditions includes information (i.e., the second table) on the air conditioning capacity of the air conditioner (Y). In this configuration, the information on the effects stored in the second storage (220) includes the information on the air conditioning capacity of the air conditioner (Y). If the size of the target area (E) is known, the second controller (230) can calculate the air volume of the air conditioner (Y) from the size of the target area (E) and the air conditioning capacity and use the air volume as a parameter for outputting the air conditions in the target area (E). This eliminates the need for an operator to input the air conditioning capacity, the air volume of the air conditioner (Y), or other data to output the air conditions in the target area (E) and increases the range of calculation for outputting analysis information by the second controller (230). This reduces the burden on the operator and allows the operator to easily check the air conditions in the target area (E).

The operator can carry the processing device (100), which is a smartphone, to the target area (E). In the target area (E), the operator performs the data input operation shown in the steps S2 to S6 and transmit, to the server (200), information indicating the result of input. In addition, the operator can obtain information indicating a result of analysis from the server (200) using the processing device (100) and check the information indicating the result of analysis on the display (110) of the processing device (100). As a result, the operator can quickly obtain the air conditions in the target area (E).

The air condition includes a plurality of conditions. The plurality of conditions correspond to a plurality of colors different from each other. The display (110) displays the plurality of conditions in distribution points of the target area (E) in the corresponding colors. In this embodiment, as illustrated in FIG. 8, the second screen (g32) of the display (110) displays older air in a darker color for each distribution point of the target area (E). As a result, the operator can easily recognize the degree of stagnation of the air for each distribution point of the target area (E).

Other Embodiments

While the embodiment and the variations thereof have been described above, it will be understood that various changes in form and details may be made without departing from the spirit and scope of the claims (e.g., the following (1) to (15)). The embodiment and the variations thereof may be combined and replaced with each other without deteriorating intended functions of the present disclosure.

(1) In this embodiment, in the step S10, the second controller (230) outputs information indicating the age of the air in the target area (E) as a result of analysis of the air conditions in the target area (E). However, the present invention is not limited to this. The second controller (230) may output information indicating the CO2 concentration in the target area (E) as a result of analysis of the air conditions in the target area (E). In this case, for example, the second screen (g32) of the display (110) shown in FIG. 8 displays, a higher CO2 concentration in a darker or lighter color for each distribution point of the target area (E). In addition, the second controller (230) may output information indicating the concentration of a volatile organic compound (VOC) in the air in the target area (E) as a result of analysis of the air conditions in the target area (E).

(2) The second controller (230) may output information indicating the concentration of solid particles in air in the target area (E) as a result of analysis of the air conditions in the target area (E). In this case, for example, the second screen (g32) of the display (110) shown in FIG. 8 displays, a higher concentration of the solid particles in the air in a darker or lighter color for each distribution point of the target area (E).

(3) The air conditions visualized by the visualization system (1) may be a flow rate distribution of the air including the direction of the air in the target area (E).

(4) Assume that the second controller (230) performs the processing of analyzing the air conditions in the target area (E) in the step S10. In this case, if the object includes an air conditioner (Y) or a fan, the second controller (230) performs the processing so that the air conditions are the same immediately before and after the air passes through the air conditioner (Y) or the fan.

(5) Assume that the second controller (230) performs the processing of analyzing the air conditions in the target area (E) in the step S10. In this case, if the object includes an air purifier, the second controller (230) performs the processing so that the air conditions are different immediately before and after the air passes through the air purifier. For example, assume that the second controller (230) may output information indicating the concentration of solid particles in the air in the target area (E) as a result of analysis of the air conditions in the target area (E). The concentration of solid particles in the air decreases by a predetermined value between before and after the air has passed through the air purifier.

Figure 9:
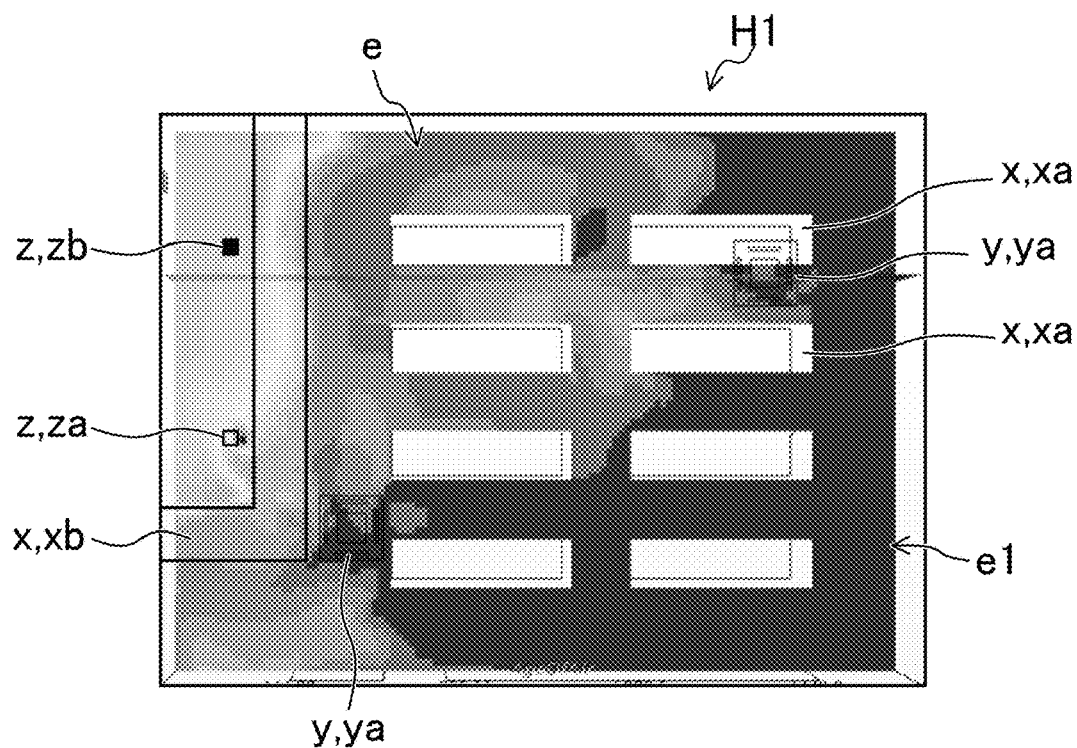
FIG. 9 shows an unimproved layout image.
Figure 10:
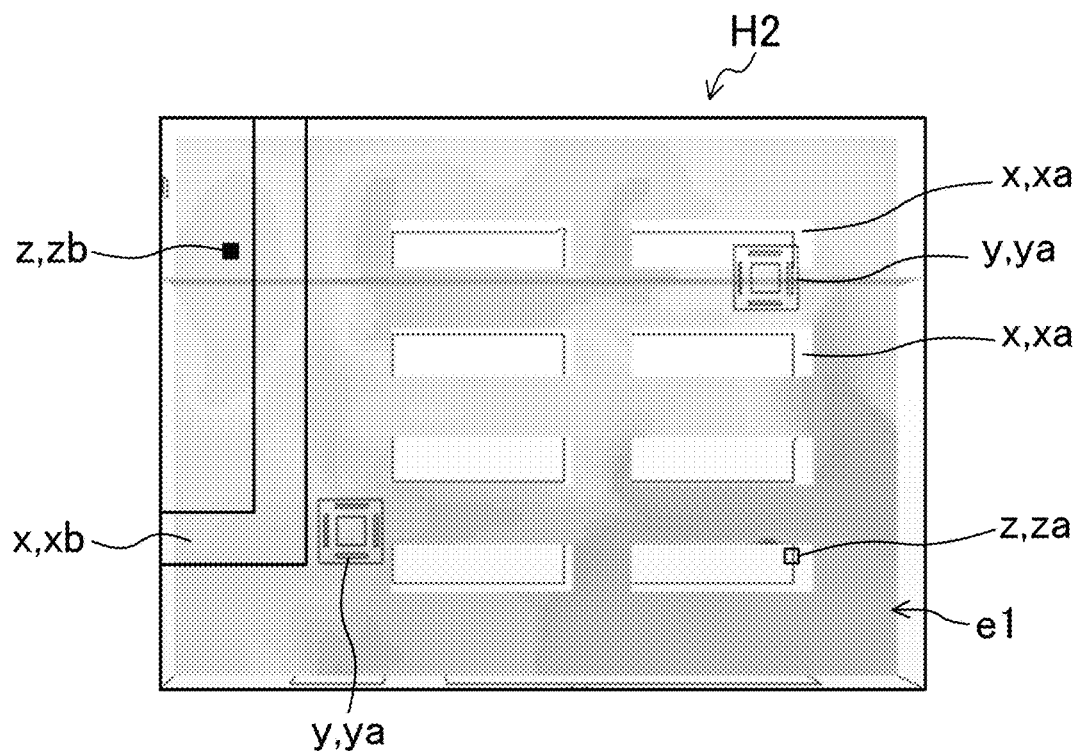
FIG. 10 shows an improved layout image.

(6) The second controller (230) may generate an improved layout image (H2) of the object image for improving the air conditions in the target area (E) output in the step S10. FIG. 9 shows an unimproved layout image (H1) which is the layout images of an object image before improvement. FIG. 10 shows the improved layout image (H2) which is the layout image of object images after improvement. As illustrated in FIG. 9, in the unimproved layout image (H1), the bottom right area (e1) of the target area image (e) is darker in color and thus contains older and more stagnant air. For example, the second controller (230) determines that the air is stagnant in the bottom right area (e1) for the following reasons. The first ventilator image (za) showing the air inlet (ZA) and the second ventilator image (zb) showing the air outlet (ZB) are too close to each other, resulting in ineffective ventilation. In this case, the second controller (230) generates the improved layout image (H2) in which the first ventilator image (za) showing the air inlet (ZA) and the second ventilator image (zb) showing the air outlet (ZB) are spaced more apart from each other than in the unimproved layout image (H1) so that the air in the bottom right (e1) is younger than a predetermined value by an optimized arrangement algorithm, reinforcement learning, or any other suitable means. For example, as illustrated in FIG. 9, the unimproved layout image (H1) includes the first ventilator image (za) showing the air inlet (ZA) and the second ventilator image (zb) showing the air outlet (ZB) vertically arranged on the left of the target area image (e). On the other hand, as shown in FIG. 10, the improved layout image (H2) shows that the second controller (230) places the first ventilator image (za) showing the air inlet (ZA) in the bottom right area (e1) to improve the air flow in the bottom right area (e1). Information indicating the improved layout image (H2) is transmitted from the server (200) to the processing device (100) and is displayed on the display (110). As a result, the operator can improve the air conditions in the target area (E) by changing the locations of the objects in view of the improved layout image (H2).

(7) The second storage (220) of the server (200) may store a learning model indicating input information and the air conditions in association with each other. The input information includes information indicates a type of the object image, information indicating a layout of the object image, and information indicating the air volume of an object shown by the object image. The second controller (230) may output information indicating the air conditions in the target area (E) using the learning model. Accordingly, once the input information is input from the receiver (120) of the processing device (100) and transmitted from the processing device (100) to the server (200), the second controller (230) of the server (200) can output information indicating the air conditions in the target area (E) using the learning model. As a result, there is no need for the second controller (230) to perform fluid analysis simulation, which reduces the calculation load on the second controller (230).

(8) The second controller (230) of the server (200) may function as a learner that relearns the learning model. In this case, the second controller (230) serving as the learner relearns the learning model using the following result of output as training data. The result of output is obtained when the second controller (230) employs the object image and the layout of the object image according to the learning model and outputs the air conditions in the form of simulation. As a result, the accuracy in analyzing the air conditions in the target area (E) improves through relearning of the learning model.

(9) The receiver (120) may receive an input of a reference index serving as a reference of an index indicating the air conditions in the target area image (e). The display (110) may display, in the target area image (e) to be distinguishable from other points. The point has an index indicating that the air conditions exceed the reference index. The index indicates, as the air conditions, the age of the air, the CO2 concentration, the VOC concentration, or the concentration of solid particles, for example. The display (110) displays, in the target area image (e), a point to be distinguishable from other points, for example, in a different color. The point has an index indicating that the air conditions exceed the reference index, that is, poor air conditions. As a result, the operator can easily check a point under poor air conditions in the target area (E) based on the content displayed on the display (110).

(10) When displaying the information indicating a result of analysis of the air conditions in the target area (E) by the server (200) on the second screen (g32) (see FIG. 8), the display (110) may display information indicating the air conditions on a horizontal plane at a height within a range from 1.0 m to 1.8 m in the target area (E). As a result, the display (110) can display the air conditions at a general height of a human face (i.e., the breathing part) in the target area (E).

(11) When various information are input from the receiver (120) (see FIG. 1) in the steps S2 to S7 shown in FIG. 2, temperature information on the target area (E) may be further input. When the result of analysis of the air conditions in the target area (E) is output by the second controller (230) in the step S10, the temperature information on the target area (E) may be taken into consideration in the result of analysis.

(12) In this embodiment, the object includes a fixture (X), an air conditioner (Y), and a ventilator (Z). However, the present invention is not limited to this. The object only needs to include at least the fixture (X) and the air conditioner (Y). The object including the fixture (X) and the air conditioner (Y) requires none of the processing in the steps S6 and S7 (see FIG. 2).

(13) In this embodiment, the server (200) performs the analysis processing (see the step S10). However, the present invention is not limited to this. The processing device (100) may perform the analysis processing. In this case, the first controller (150) of the processing device (100) functions as the second controller (230) of the server (200), and the first storage (140) of the processing device (100) functions as the second storage (220) of the server (200).

(14) In this embodiment, in the steps S2 to S7 (see FIG. 2), various information are input from the receiver (120) which is a touch panel. However, the present invention is not limited to this. The receiver (120) may be a keyboard or a mouse, for example, from which the various information is input.

(15) In this embodiment, the input operation of the various information from the touch panel in the steps S2 to S7 (see FIG. 2) and the display processing of the result of analysis in the step S13 are performed on the same display (110). However, the present invention is not limited to this. The display processing of the result of analysis may be performed on a display of a terminal different from the processing device (100).

INDUSTRIAL APPLICABILITY

As described above, the present disclosure is useful as a visualization system and a program.

EXPLANATION OF REFERENCES

1 Visualization System
100 Processing Device
110 Display
120 Receiver
130 First Communicator (Transmitting Section, Receiving Section)
200 Server
220 Second Storage (Storage)
221 First Correspondence Information (Correspondence Information)
222 Second Correspondence Information (Correspondence Information)
223 Third Correspondence Information (Correspondence Information)
230 Second Controller (Controller)
e Target Area Image
E Target Area
X Fixture
Y Air Conditioner
Z Ventilator

What is claimed is:

1. A visualization system comprising:
a receiver configured to receive an input of arrangement information indicating a location of an object image on a target area image showing a target area set by an operator;
a storage configured to store correspondence information indicating the object image and information on an effect of an object shown by the object image on an air condition in association with each other; and
a controller configured to output information indicating an air condition of the target area based on the arrangement information on the object image and the correspondence information,
the object including an air conditioner,
the information on an effect of the air conditioner on the air condition including information on an air conditioning capacity of the air conditioner, the receiver receiving an input of size information on a size of the target area,
the controller outputting an air volume of the air conditioner based on the size information and the air conditioning capacity of the air conditioner and outputting information indicating the air condition of the target area further based on the air volume of the air conditioner,
wherein the correspondence information is previously stored in the storage,
the correspondence information being for each of a plurality of types of fixture images, a plurality of types of air conditioner images, a plurality of types of ventilator images, which are the object images for which arrangement information is set by the operator, and
the effect information corresponds to each of the plurality of types of fixture images, the plurality of types of air conditioner images, the plurality of types of ventilator images in the correspondence information.

2. The visualization system of claim 1, wherein the controller obtains the air conditioning capacity required for the target area based on the size information, and outputs the air volume of the air conditioner corresponding to the air conditioning capacity.

3. The visualization system of claim 1, wherein the object includes a ventilator.

4. The visualization system of claim 3, wherein
the receiver receives an input of an index on an amount of ventilation by the ventilator in the target area, and
the controller outputs the information indicating the air condition of the target area further based on the index on the amount of ventilation.

5. The visualization system of claim 1, wherein
the information indicating the air condition of the target area includes information indicating an age of air in the target area.

6. The visualization system of claim 1, wherein
the information indicating the air condition of the target area includes information indicating a $CO_2$ concentration in the target area.

7. The visualization system of claim 1, wherein
the information indicating the air condition of the target area includes information indicating a concentration of solid particles in air in the target area.

8. The visualization system of claim 1, wherein if the object includes the air conditioner or a fan, the controller controls the air condition so that the air condition in an area immediately before the air passes through the air conditioner or the fan and the air condition in an area immediately after the air passes through the air conditioner or the fan are the same.

9. The visualization system of claim 1, wherein
if the object includes an air purifier, the controller performs processing so that the air condition is different immediately before and after the air passes through the air purifier.

10. The visualization system of claim 1, wherein
the controller generates an improved layout image of the object image for improving the air condition of the target area output based on the arrangement information on the object image and the correspondence information.

11. The visualization system of claim 1, wherein
the storage stores a learning model indicating input information and the air condition of association with each other, the input information including information indicating a type of the object image, information indicating a layout of the object image, and information indicating an air volume of an object shown by the object image, and
the controller outputs the information indicating the air condition of the target area using the learning model.

12. The visualization system of claim 11, further comprising:
a learner configured to relearn the learning model using, as training data, a result of output when the controller employs the object image and a layout of the object image according to the learning model and outputs the air condition by simulation.

13. The visualization system of claim 1, further comprising:
a display configured to display at least one of information indicating the target area image or the information indicating the air condition of the target area.

14. The visualization system of claim 13, wherein
air condition includes a plurality of conditions,
the plurality of conditions correspond to a plurality of colors different from each other, and
the display displays the plurality of conditions in distribution point s of the target area in the corresponding colors.

15. The visualization system of claim 13, wherein
the receiver receives an input of a reference index serving as a reference of an index indicating the air condition in the target area image, and
the display displays, in the target area image, a point to be distinguishable from other points, the point having an index indicating that the air condition exceeds the reference index.

16. The visualization system of claim 13, wherein
the display displays information indicating the air condition on a horizontal plane with a height within a range from 1.0 m to 1.8 m in the target area.

17. A non-transitory computer readable medium storing a control program of a visualization system for causing a computer to function as:
a receiver configured to receive an input of arrangement information indicating a location of an object image on a target area image showing a target area set by an operator;
a transmitting section configured to transmit the arrangement information to a server; and a receiving section configured to receive information indicating an air condition of the target area from the server;
the server being configured to store correspondence information indicating the object image and information on an effect of an object shown by the object image on an air condition in association with each other, and output the information indicating the air condition of the target area based on the arrangement information on the object image and the correspondence information,
the object including an air conditioner,
the information on the effect of regarding the air condition of the air conditioner including the air conditioning capacity of the air conditioner,
the receiver receiving an input of size information on a size of the target area,
the server outputting an air volume of the air conditioner based on the size information and the air conditioning capacity of the air conditioner and outputting information indicating the air condition of the target area further based on the air volume of the air conditioner,
wherein the correspondence information is previously stored in the storage,
the correspondence information being for each of a plurality of types of fixture images, a plurality of types of air conditioner images, a plurality of types of ventilator images, which are the object images for which arrangement information is set by the operator, and
the effect information corresponds to each of the plurality of types of fixture images, the plurality of types of air conditioner images, the plurality of types of ventilator images in the correspondence information.

* * * * *